(12) United States Patent
Ganter (10) Patent No.: US 9,014,303 B2
(45) Date of Patent: Apr. 21, 2015

(54) RECEIVER APPARATUS AND METHOD FOR CARRIER STATE MODULATION

(75) Inventor: William A. Ganter, Boulder, CO (US)

(73) Assignee: Custom Link Corporation, Boulder, CO (US)

(*) Notice: Subject to any disclaimer, the term of this patent is extended or adjusted under 35 U.S.C. 154(b) by 247 days.

(21) Appl. No.: 13/636,382

(22) PCT Filed: Mar. 25, 2011

(86) PCT No.: PCT/US2011/030011
§ 371 (c)(1),
(2), (4) Date: Oct. 25, 2012

(87) PCT Pub. No.: WO2011/119971
PCT Pub. Date: Sep. 29, 2011

(65) Prior Publication Data
US 2013/0034183 A1  Feb. 7, 2013

Related U.S. Application Data

(60) Provisional application No. 61/317,387, filed on Mar. 25, 2010.

(51) Int. Cl.
*H04L 27/06* (2006.01)
*H04L 27/36* (2006.01)
*H03M 5/22* (2006.01)

(52) U.S. Cl.
CPC *H04L 27/36* (2013.01); *H03M 5/22* (2013.01)

(58) Field of Classification Search
CPC ............ H04L 27/02; H04L 2027/0032; H04L 27/2647; H04L 1/20; H04L 25/067; H04L 1/0045; H04L 1/005; H04L 1/0054; H04B 10/541; H04B 1/30; H04B 1/28; H04N 5/4401
USPC ......... 375/268, 285, 316, 322, 340, 346, 377; 329/347, 349, 353
See application file for complete search history.

(56) References Cited

U.S. PATENT DOCUMENTS

| 4,575,709 A * | 3/1986 | Tomlinson .................... 341/110 |
| 4,613,974 A | 9/1986 | Vokac et al. |
| 6,341,146 B1 * | 1/2002 | Johnson et al. ............... 375/329 |
| 6,493,398 B1 | 12/2002 | Erisman |
| 2008/0039107 A1 | 2/2008 | Ma et al. |
| 2009/0221257 A1 | 9/2009 | Sorrells et al. |

* cited by examiner

*Primary Examiner* — Tesfaldet Bocure
(74) *Attorney, Agent, or Firm* — Frommer Lawrence & Haug LLP; William S. Frommer; Paul A. Levy (57) ABSTRACT

A carrier state modulator system is described in which a stream of digital data bits is encoded by modulating the amplitude or phase of a carrier wave. A transmitter modulates the amplitude of a selected number cycles of the carrier in accordance with the state of each digital data bit. A receiver decodes the carrier state modulated signal by determining a phase score for the specified number of cycles of the modulated signal, the phase score based on a number of samples of the amplitude on a positive side of each cycle of the modulated signal that is above a selected amplitude and a second number of samples of an amplitude on a negative side of each cycle of the modulated signal that is below the selected amplitude. The value of the encoded digital data bit of the modulated signal is determined from the phase score.

16 Claims, 8 Drawing Sheets

Fig. 1 TRANSMITTER

Fig. 2 RECEIVER

Fig. 3

Fig. 5a

RECEIVER APPARATUS AND METHOD FOR CARRIER STATE MODULATION

This application is filed under 35 U.S.C. 371 as a National Phase Application of International Application PCT/US2011/030011 filed Mar. 25, 2011, and claims the priority filing date to U.S. provisional application Ser. No. 61/317,387 filed Mar. 25, 2010, the entirety which are incorporated herein by reference.

BACKGROUND

Wireless spectrum for RF data transmissions is scarce due to massively increased demands. Therefore, methods that can improve spectral utilization are needed. Spectrum sharing and local reuse are two ways to gain improvement, as well as signal design and detection technology advances. Digitized data is often transmitted using baseband tuning and filtering at a receiver. Filter tuning rejects by attenuation most other frequencies that are outside of the channel passband. However, tuning by filtering limits the data rate that can be transmitted in a band of spectrum, as the baseband content cannot change rapidly because it is being averaged over time by the filter.

SUMMARY OF THE INVENTION

The carrier state modulator system of the present disclosure includes a transmitter for transmitting one or more bits of digital data. The transmitter includes an oscillator to generate a carrier frequency having a voltage amplitude and a modulator to modulate the voltage amplitude on the basis of the one or more bits of digital data and to output a carrier state modulated signal. A transmitter transmits the carrier state modulated signal, wherein the modulator modulates a specified number cycles of the carrier frequency for each bit of the one or more bits of digital data.

The carrier state modulator system of the present disclosure also includes a receiver for demodulating digital data bits from a carrier state modulated signal received from a transmitter. The receiver includes an antenna to receive the carrier state modulated signal and a statistical detector to determine a phase score for a specified number of cycles of the carrier state modulated signal based on a first number of samples of an amplitude on a positive side of each cycle of the carder state modulated signal that is above a selected amplitude and a second number of samples of an amplitude on a negative side of each cycle of the carrier state modulated signal that is below the selected amplitude. A controller can demodulate a value of a digital data bit of the carrier state modulated signal based on the phase score; and an interface unit outputs the value of the digital data bit of the carrier state modulated signal.

DETAILED DESCRIPTION

The present invention is an alternative to baseband tuning and filtering. The spectrally narrow signal design of the present techniques employ a statistically based tuning apparatus and method for data detection that can yield a higher data rate and a higher spectral efficiency than filter tuning, as measured in bits per second based upon the baseband or carrier frequency (bps/Hz).

The present technique is referred to herein as Carrier State Modulation (CSM). A simplified overview of the technique is described with reference to the apparatus of the present invention diagramed in FIG. 1 and FIG. 2. The CSM system includes a transmitter 100 and a receiver 200. A simplified embodiment of transmitter 100 in accordance with the present invention can include a carrier oscillator 116 that generates a carrier signal at a frequency (f) of n Hz, where n is an integer. Typically, the carrier signal is sinusoidal but that is not a limitation. Digital data that is to be transmitted is input in a stream of digital bits 110.

Figure 1:
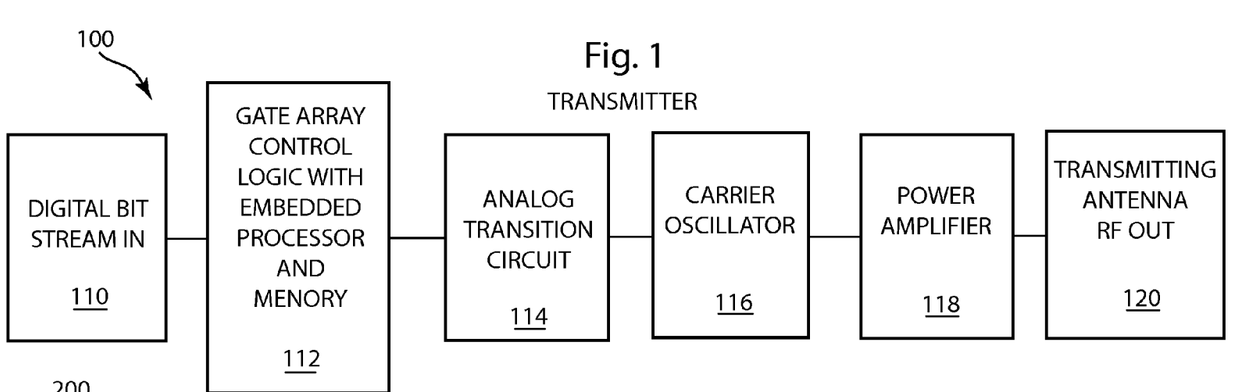
FIG. 1 is a block diagram of an embodiment of a transmitter of a carrier state modulator in accordance with the present invention.

Control logic 112 integrates the modulation for the carrier signal and the stream of digital bits. Control logic 112 can include a central processing unit (CPU), gate array logic, or similar programmable logic and a memory, and a modulation output interface to the analog transition circuit 114. Memory within 112 may be used to store the stream of digital bits from input interface 110. The logic or processor within 112 applies a specified number of cycles of the carrier signal that will be used to code each bit of the digital bit stream. A modulator circuit 114 modulates the specified number cycles of the carrier oscillator 116 signal at a specified voltage level, for each bit of the digital bit stream. The CSM signal is amplified in a power amplifier 118 and transmitted by, for example, an antenna 120, although other transmission techniques are contemplated without detracting from the techniques described.

Figure 2:
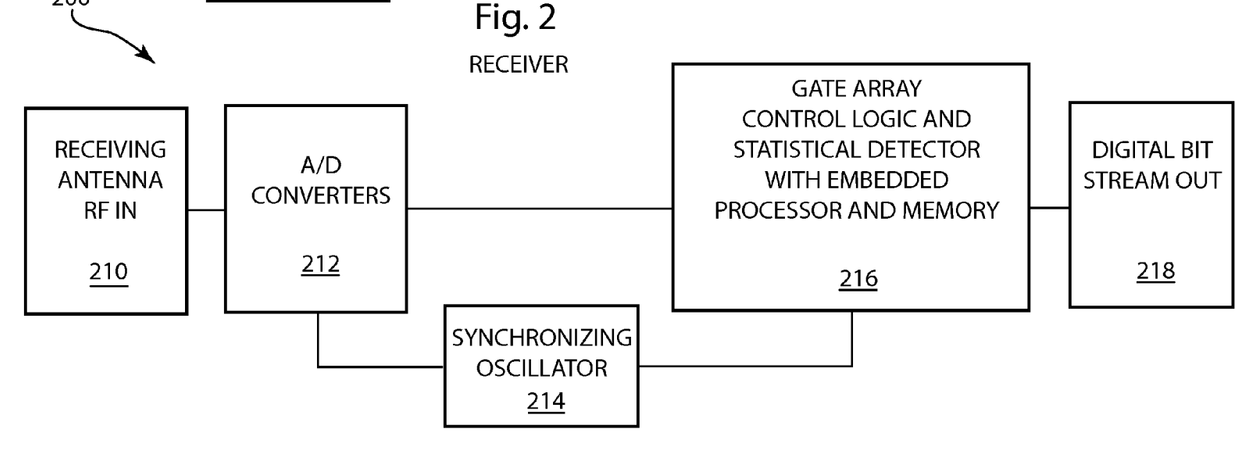
FIG. 2 is a block diagram of an embodiment of a receiver of a carrier state modulator in accordance with the present invention.

FIG. 2 illustrates a simplified embodiment of a receiver 200 in accordance with the present invention. Receiver 200 can include an antenna 210 to receive the CSM signal. Note that antenna 210 also receives transmissions from transmitters close to the frequency of the CSM signal but unrelated to the CSM signal. At least two analog-to-digital (A/D) converters 212 detect the amplitude at two points on the CSM signal. In an implementation, the A/D converters detect the CSM signal amplitude of a sinusoidal wave at about the peaks of $\pi/2$ radians (90°) and $3\pi/2$ radians (270°). A/D converters 212 receive input from a synchronizing oscillator 214 aligned to the CSM transmitter oscillator. Accordingly, it may be appropriate, during initialization of the system, to use a computation on A/D samples within the logic and processor module 216 to synchronize the receiver oscillator to the transmitter oscillator. Similarly, A/D converters 212 may be synchronized to receiver oscillator 214 for detecting the appropriate peaks of the CSM signal and the bit coding boundaries of n cycles.

The amplitudes sampled by A/D converters 212 are provided to control logic 216 for statistical and logical analysis. Control logic module 216 can include a central processing unit (CPU), gate array logic, or similar programmable logic, a memory, a statistical analyzer, and an output interface 218 for the decoded bit stream. Control logic 216 can count the detected amplitudes of the A/D converters that are at an expected level as compared to the oscillator synchronization 214. Statistical analyzer within 216 can determine a number amplitudes above, or below, the expected level over the specified number of cycles and determine therefrom a digital level coded by the transmitter in the CSM signal. The determined digital level of the bit is output through any convenient output device 218 such as digital readout, oscilloscope, or device that can store or operate upon the de-coded bit stream.

In an example, the frequency (f) of the carrier signal is 5 Ghz (gigahertz) and the specified number of cycles, n, for encoding each digital bit is 10 cycles. That is, 10 cycles of the carrier signal are used to transmit each digital bit. Presuming the digital data is binary, the data has only two states (e.g. 0 or 1) the rate at which data bits are transmitted is 5 Ghz divided by 10 or (f/n), which is 500 Mbps (megabits per second). The transmitter modulates the carrier signal to cause the power amplifier to enhance the carrier signal for the specified number of cycles to indicate a digital 1 state. Alternatively, the power amplifier could reduce the carrier signal for the specified number of cycles to indicate a digital 0 state. Alternatively, the power amplifier could both amplify for a 1 state and attenuate for a state. It is noted that there could be more than two states, in which case various levels of amplification and attenuation can be used. As such, the carrier signal amplitude is modulated with the bit states of the bit stream. The resultant CSM signal is then transmitted.

The data coding states in Carrier State Modulation transmission are a carrier power level held for an integer n cycles. In a simple embodiment there just two modulation states; a low power state codes a 0 bit and a higher power state codes a 1 bit. For j repeated bits of the same value, the power level of the CSM signal is maintained for jn Hz cycles. For example, the power level is held for 2n cycles for duplicated bits such as 00 or 11 coding.

A slower transition between coding states implemented in analog circuit 114 will tend to generate less interference in the form of low power radiations in many frequencies. As n becomes larger, a transition between states may take several cycles of the carrier signal to complete so as not to generate spurious power generation in other frequencies. The minimum n in the present invention is 1 cycle of the carrier signal.

When the carrier signal frequency is in, for example, the GHz frequency range, n could be quite large. The data rate is f/n bps, which is the carrier frequency, f, divided by n cycles of the carrier signal bits per second. That is, one bit in n cycles of the carrier transmission frequency. For example, a 4 GHz carrier with n=20 yields 200 Mbps for a two-state digital signal. In a 4-state digital signal embodiment, the data rate would be 2f/n, as each state codes one of each 2-bit sequence: 00, 01, 10, and 11. Because the data is coded on the carrier directly, the present technique is a single frequency transmission, that can occupy a very narrow band, for example a 12.5 KHz license, even at GHz frequencies with a sufficiently stable carrier oscillator 116. This feature has the advantage of high spectral utilization in bps/Hz as compared with traditional baseband and filtering transmission.

A method of the present disclosure utilizes statistical computational tuning. The A/D samples from converter 212 are composed of a superposition of the entire RF receiving antenna 210; this composite analog signal contains the Carrier State Modulation transmission together with the background noise and transmissions on nearby frequencies. Background noise is a superposition of random sources which reinforce and cancel, resulting in an amplitude signal called the noise floor. This same noise floor is present in a filter tuned passband also.

The receiver disclosed herein is designed to realize the benefits of narrow spectrum occupancy together with the f/n bps data rate. Filter tuning cannot be used as the carrier power states would be averaged to their mid-amplitude value. Instead, the Carrier State Modulation signal and all nearby frequency transmissions are received and coexist in the antenna of the receiver, and a statistical method is employed to process out the Carrier State Modulation signal therefrom. Well-known methods of directional antenna design, RF shielded housings, and physical waveguides may be used in combinations to reduce the unwanted other transmissions and noise being received, prior to applying the statistical digital tuning techniques disclosed herein.

The present technique requires at least two A/D samples of the CSM signal for each cycle of the carrier wave, but is often advantaged by having any larger even number of such samples in each cycle. Other independent transmissions in nearby frequencies that are received by the antenna have different amplitudes and phases that also cancel and reinforce randomly. These other independent transmissions are superposed and coexist with the CSM signal on the antenna and, as such, affect the detected value in each A/D sample.

A statistical technique is used to detect the coded digital value of the CSM signal among the unwanted independent transmissions. A statistical tuner detector within module 216 is briefly described in words in this section, but is shown by graphical examples in FIGS. 3 through 6, and numerically tabulated within the detailed description that follows. The receiver oscillator 214 can be synchronized with the carrier oscillator in the control logic gate array 216 of the receiver. A second synchronizing computation within module 216 may be used to synchronize the A/D converters 212 in the receiver. In an implementation, synchronization provides for the two A/D samples per cycle to be aligned at $\pi/2$ and $3\pi/2$ radians of the carrier sine wave. That is, at the carrier wave maximum amplitude.

Each digital bit is coded using n cycles of the carrier signal. In a binary bit a 1 state can be coded as a higher power level of the CSM signal than the lower power 0 state over the n cycles of the carrier signal. The n state coding boundaries are located, for example, as denoted in the FIG. 3, having a coding boundary every 6 cycles of the carrier signal, and in FIG. 4, having a coding boundary every 10 cycles of the carrier signal. In the lower power state the amplitude approaches zero but stays high enough to just maintain synchronization. The random superposition of all the unwanted other transmissions received in the antenna has varying phase and amplitude that is always different in time and is different from the Carrier State Modulation signal transmission.

Statistics of the A/D superposition across n cycles are tabulated, analyzed and monitored by the statistical detector. A statistic herein referred to as phase score is used for detection of the Carrier State Modulation bit coded states. The present technique is data rate adaptive so that n can be increased, or decreased, as necessary when the statistics of the superposition have more, or less, variation. Further, the probability of a detection error can be reduced by selection of n, using the sampled statistics. The appropriate choice of n can allow for successful transmission in nearly any RF congested location, at data rate f/n.

The details of the techniques disclosed are described with reference to FIG. 3, FIG. 4, FIG. 5 and FIG. 6. FIGS. 3-6 are the results of simulated experiments performed using computer modeling. These computer modeled experiments are referred to herein as experiments. The received amplitudes in antenna 210 decrease across these four experiments. These are 150, 100, 50 and 28 mV respectively. Received amplitudes decrease as link spans (i.e., transmission distances) increase. Lower received amplitudes are affected by the background RF noise and by the relative strengths of other independent transmissions in the receiving antenna. Four methods are presented to distinguish CSM signals amongst the others in the receiving antenna. These are (1) the choice of a, (2) the use of redundancy, (3) the coding of the 0 bit with out-of-phase transmission for n carrier cycles, and (4) the subtraction of known strong other transmissions in the receiving antenna. Each of the techniques is described, herein below. It should be appreciated that any combination of these 4 methods can used to optimize a CSM link for data rate and error free detection with respect to the other independent transmissions and random background RF noise in receiving antenna 210.

The phase score statistic for the statistical detection method of the present disclosure is defined as follows. In a receiver having two A/D converters, one at $\pi/2$ radians and one at $3\pi/2$ radian, one count is recorded when the first of two A/D samples has a positive value above DC at 0 mV and the count is incremented by one when the second A/D sample has a negative value below DC at 0 on the same cycle of the CSM signal. The count is incremented for each cycle of the CSM signal within the coding boundary. The expected value of the phase score for the other independent transmitters alone at random phase is n. That is, the randomness of the other transmissions results in an expected value for the count equal to the number of cycles in the coding boundary as the probability is 0.5 for the random composite to be either in the correct phase or not over the 2n A/D samples of an a cycle bit coding cell. The minimum value for a phase score is 0 and the maximum value is 2n, when 2 A/D per CSM carrier cycle are used.

A threshold for demodulating a 1 bit coding and 0 bit coding from the phase score can be set based upon an initial calibration between the transmitter and receiver of the CSM signal. An integer value for phase score is used because the count resulting from the A/D converter values is an integer and thus avoids having a phase score with an indeterminate coding. A nominal but often non integer value for a threshold is 1.5n, and the integer threshold may be selected near this nominal estimate.

Figure 3:
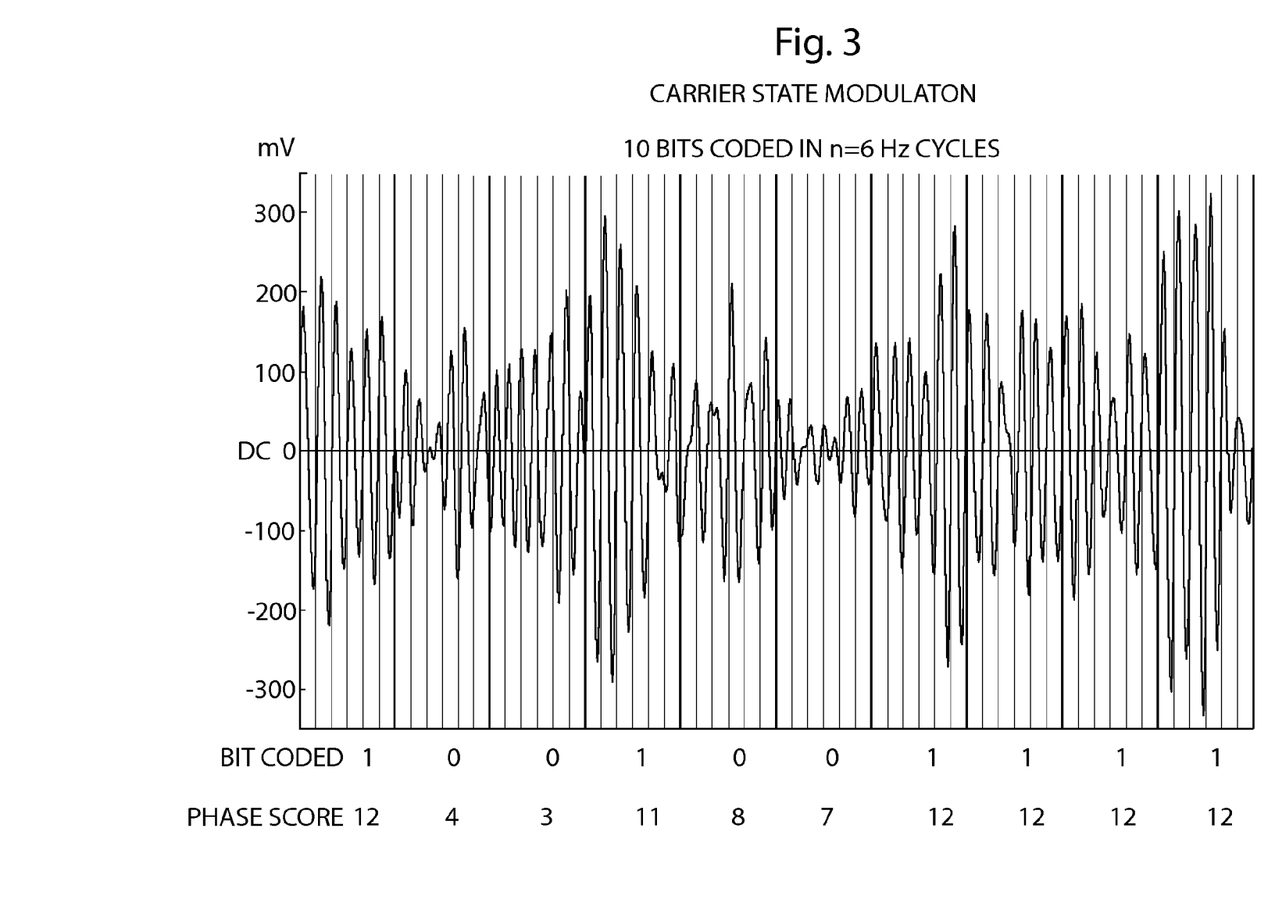
FIG. 3 illustrates a carrier state modulated signal for 10 digital bits each coded in 6 cycles of the carrier wave.

FIG. 3 illustrates a CSM signal received by the receiver in a first experiment that included the Cartier State Modulation signal plus 13 unwanted other transmissions in the antenna passband. The digital data coded in the CSM signal in the transmitter was 1001001111. The raw A/D sample data recorded from the receiving antenna is shown in Table 1 for the first bit coded as a 1:

TABLE 1

| Relative frequency | Amplitude (mV) | Relative phase | Contribution to first A/D (mV) | Contribution to second A/D (mV |
|---|---|---|---|---|
| 0.700 | 19.0 | 0.6 | −18.52 | 0.00 |
| 0.734 | 43.5 | 0.3 | −12.13 | 43.01 |
| 0.845 | 30.5 | −0.9 | −30.39 | 24.10 |

TABLE 1-continued

| Relative frequency | Amplitude (mV) | Relative phase | Contribution to first A/D (mV) | Contribution to second A/D (mV |
|---|---|---|---|---|
| 0.878 | 44.5 | 0.5 | −18.81 | 34.10 |
| 0.902 | 33.5 | −0.4 | 11.43 | −21.31 |
| 0.936 | 22.0 | 0.2 | 15.66 | −12.01 |
| 1.000 | 150.0 | 0.0 | 150.00 | −150.00 |
| 1.034 | 35.5 | −0.1 | 33.28 | −31.83 |
| 1.097 | 26.5 | −0.5 | 0.00 | 7.27 |
| 1.130 | 31.5 | 0.4 | 18.80 | −26.52 |
| 1.165 | 37.0 | −0.7 | 26.77 | −13.17 |
| 1.213 | 16.0 | −0.6 | −4.10 | 11.60 |
| 1.264 | 7.5 | −0.3 | 3.58 | 1.19 |
| 1.300 | 11.5 | 0.7 | 2.75 | −9.46 |

The sum of the superposition contributions to the first A/D is 178.37 and could be reported as an integer of 178 mV. Notice that the unwanted other transmissions (those having a relative frequency other than 1.000) are randomly distributed about the CSM signal frequency and, as such, the amplitudes tend to cancel one another. Note also that the CSM signal (relative frequency 1.000) at 150 mV is the strongest received amplitude and that it has relative phase 0.0 when the A/D is synchronized to the CSM signal. The contribution formula for each other transmission to the first A/D detected value can be calculated according to equation 1:

$$\text{contribution} = \text{amplitude} * \sin[(\text{phase}+0.5)*\pi/\text{frequency}] \quad (1)$$

For example, in Table 1, the contribution for the carrier at 0.700 relative frequency from the first A/D at $\pi/2$ is computed as:

$$19*\sin[(0.6+0.5)*\pi/0.7] = 19*(-0.9749) = -18.52,$$

as shown in Table 1.

Similarly, the contribution formula for each other transmission from the second A/D at $3\pi/2$ can be calculated according to equation 2:

$$\text{contribution} = \text{amplitude} * \sin[(\text{phase}+1.5)*\pi/\text{frequency}] \quad (2)$$

For example, in Table 1, the contribution for the carrier at 0.700 relative frequency from the second A/D at $3\pi/2$ is computed as: $19*\sin[(0.6+1.5)*\pi/0.7] = 19*\sin(3\pi) = 0$. These values are shown in Table 1. That is each subsequent A/D increments by one $\pi$ in formula 1.

In the experiment of FIG. 3, the receiver threshold for 1 bit and 0 bit detection was set at 9.5. That is, when the phase score is 9 or lower the receiver decodes a 0 bit, and when the phase score is 10 or above the receiver decodes a 1 bit. When this range seems too narrow around the threshold, n can be increased to increase range.

In the FIG. 3 example, the 12 A/D sample values for the first bit coded (as a 1) were 178, −143, 162, −187, 178, −148, 128, −133, 152, −167, 158 and −119, resulting in a phase score of 12. This is because the superposition amplitude has the correct sign for a full power (i.e., maximum modulating amplitude) 1 bit in all 12 of these A/D samples. The 12 A/D samples for the second bit coded (as a 0) were −79, 95, −58, 6, 3, 33, −50, 4, 62, −68, 7 and 38. Note that only 4 of these A/D samples have the correct sign for a full power 1 bit, resulting in a phase score of only 4. The 4 samples within this sequence of 12 samples with the correct sign for a Carrier State Modulation full power 1 coded bit are 3, 62, −68 and 7. Since 4 is less than the 9.5 threshold, the receiver would decode this second bit state as a 0 bit.

The coded 0 bit state by the transmitter was at an amplitude just high enough to maintain phase and synchronization, and the 1 bit coded state amplitude was received at 150 mV in this experiment, although other 1 bit encoding amplitudes can be used, as discussed herein below. The coded states span a 6 cycles in the FIG. 3 example, graphed as light shade vertical grids, with a dark vertical grids at the coding state boundaries.

FIG. 3 coded 10 bits in the sequence 1001001111. The phase scores for these 10 coded bits in n=6 cycles were 12, 4, 3, 11, 8, 7, 12, 12, 12 and 12, respectively. The expected value of the phase score is 6 for a coded 0 bit state. In this experiment, the four 0 coded bits had a sample mean of 4+3+8+7=22 divided by 4, which is 5.50. The sample mean of the six 1 coded bit states was measured as (12+11+12+12+12+12)/6=11.83. The above 10 coded bits are shown at the bottom of FIG. 3 along with the above 10 phase scores.

Figure 4:
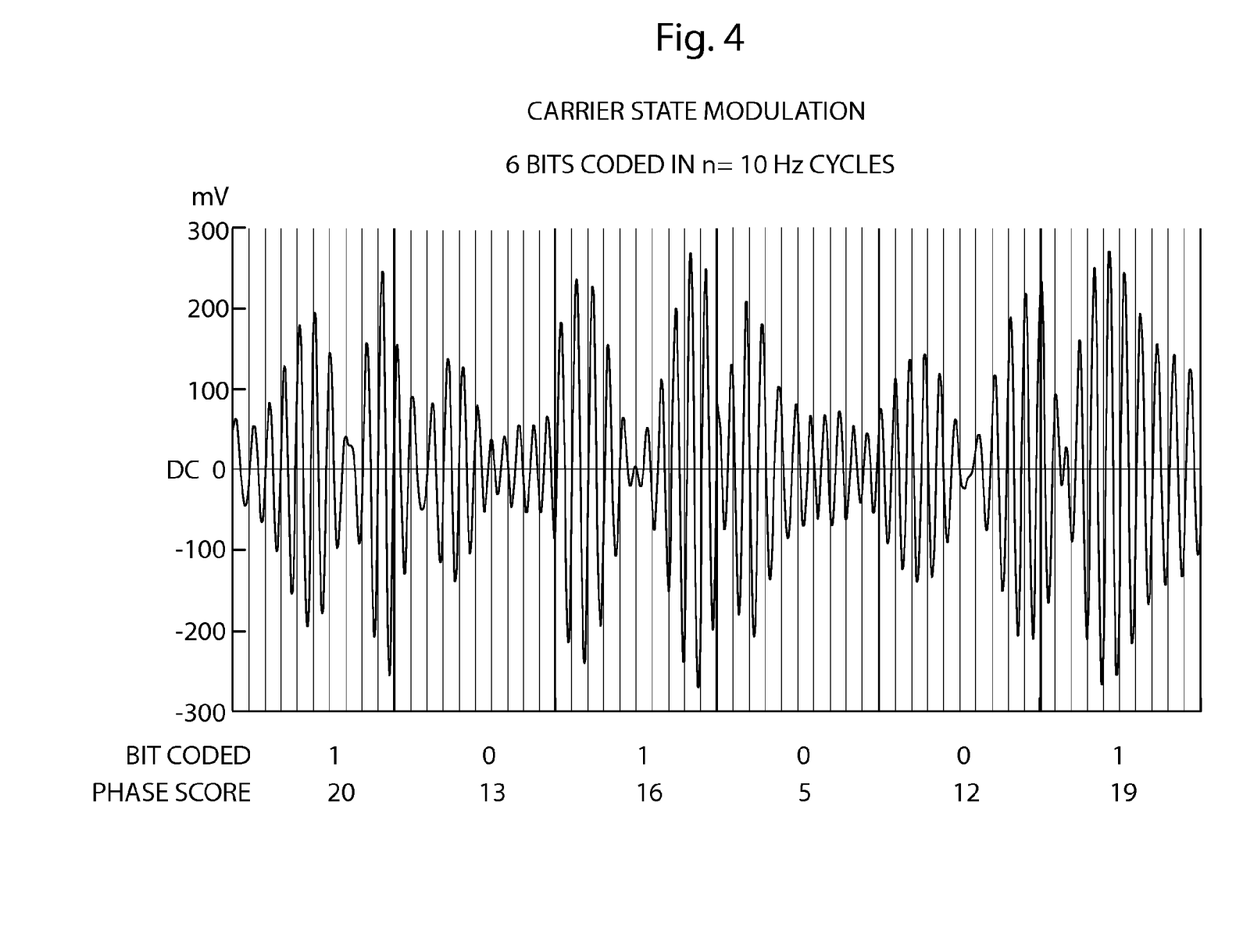
FIG. 4 illustrates a carrier state modulated signal for 6 digital bits each coded in 10 cycles of the carrier wave.

FIG. 4 illustrates a CSM signal received by the receiver in a second experiment that included the Carrier State Modulation signal plus 11 unwanted other transmissions in the antenna passband. Data bits are coded in n=10 cycles of the carrier signal. There are 6 coded bit states in FIG. 4. The coded states and their respective phase scores are shown below the received CSM signal in FIG. 4. The CSM signal was received at an amplitude of 100 mV for a 1 bit rather than the 150 mV in the experiment of FIG. 3. In the experiment of FIG. 4, n was set larger at 10, compared to 6 in the experiment of FIG. 3 to compensate for the lower received amplitude, which could make distinguishing a 1 bit from a 0 bit on the receiver side more difficult. In both FIG. 3 and FIG. 4 experiments, there are 2 A/D samples per cycle of the carrier wave, adjusted to be centered at $\pi/2$ and $3\pi/2$. In other embodiments of the present invention, 4 or 6 A/D samples per cycle of the CSM signal can be provided for in the hardware.

The digital data coded in the CSM signal was 101001. The raw data recorded from the antenna is shown in Table 2 for the first bit coded as a 1:

TABLE 2

| Relative frequency | Amplitude (mV) | Relative phase | Contribution to first A/D (mV) |
|---|---|---|---|
| 0.800 | 15 | −0.6 | −5.74 |
| 0.834 | 35 | 0.3 | 4.47 |
| 0.865 | 55 | 0.9 | −51.23 |
| 0.892 | 40 | 0.5 | −14.85 |
| 0.902 | 45 | −0.4 | 15.36 |
| 0.936 | 20 | 0.2 | 14.24 |
| 1.000 | 100 | 0.0 | 100.00 |
| 1.026 | 60 | 0.7 | −30.48 |
| 1.081 | 25 | −0.5 | 0.00 |
| 1.125 | 15 | 0.4 | 8.82 |
| 1.161 | 20 | −0.2 | 14.51 |
| 1.200 | 10 | −0.6 | −2.58 |

Similar to Table 1, the contribution formula for each other transmission to the first A/D detected value can be calculated according to equation 1. The contribution to the second A/D detected value can be calculated according to equation 2 and is not shown in Table 2.

The sum of the contributions is 52.52, which is reported as integer 53. Note that if a 0 bit had been coded instead in these first n=10 cycles, the first A/D sample would have been 53-100=-47 and would have been of the wrong phase to score.

In the experiment of FIG. 4 there were coded 6 bits in the sequence 101001. The phase scores of these 6 coded bits in n=10 cycles of the carrier frequency boundaries were measured as 20, 13, 16, 5, 12 and 19, respectively. The expected value for the 0 bit state is 10, the value of n, which is a result the randomness of the unwanted other transmissions, as discussed above in the experiment of FIG. 3. The sample mean of the coded 0 bits was 13+5+12=30 divided by 3, which is 10. In this experiment, a threshold value for the phase score could be set at 15.5, so that a phase score of 15 or less would be decoded as a 0 bit and a phase score of 16 and above would be decoded as a 1 bit. The maximum phase score for a 1 bit is 20 in each coding boundary because the 1 coded state can have a maximum of two readings above DC at zero from each of the two A/D converters on each of the 10 cycles in the coding boundary.

Figure 4A:
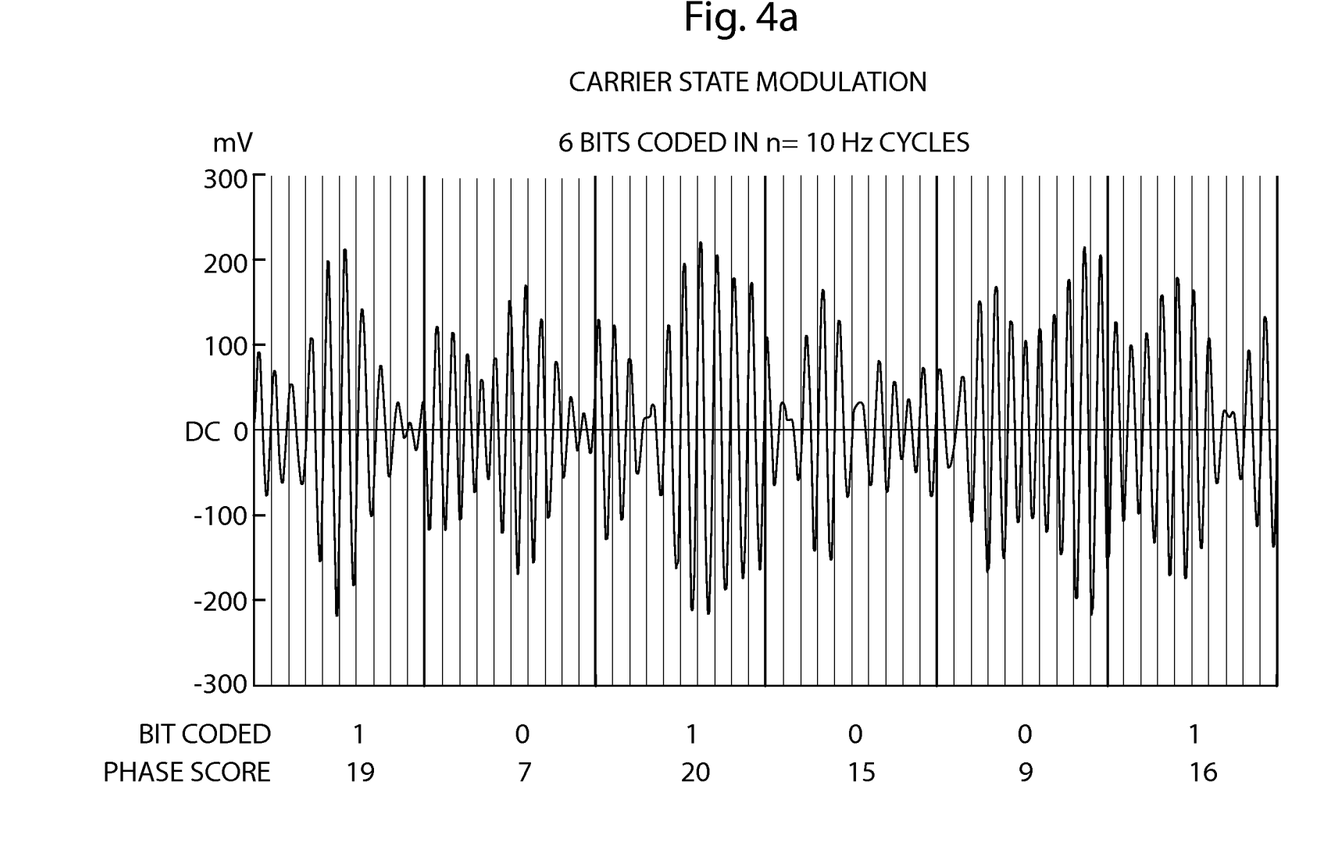
FIG. 4a illustrates a redundant carrier state modulated signal for the 6 digital bits each coded in 10 cycles of the carrier wave of FIG. 4.

The third bit was coded as a 1 bit state and the phase score resulted in a value of 16, which is at the threshold borderline between a decoding a 1 coded bit and 0 coded bit. An error could be made in decoding a bit having a phase score on the threshold borderline. One approach to minimizing possible borderline decoding errors is to redundantly resend the same sequence of bits and re-determine the phase scores. FIG. 4a graphs an extension of the experiment of FIG. 4 for 6 more groups of n=10 that redundantly code the same 101001 bit sequence. The phase scores for the redundantly transmitted sequence were 19, 7, 20, 15, 9 and 16. This FIG. 4a example illustrates the method (2) of the present disclosure, the use of redundancy.

In the present technique, the superposition A/D samples of the other transmissions are independent random variables. When a CSM signal 1 bit is coded, this adds a systematic order on top of these random variables. Hence the phase scores depend upon the present superposition, which always differs.

In the redundant transmissions of FIG. 4 and FIG. 4a, there was a phase score of 20 and a 19, respectively, for the initial 1 coded bit. The scores for the second 0 coded bit were 13 and 7, respectively. Using redundancy, the receiver could detect these two 6 sequence bits by using the higher of two phase scores (20) for the coded 1 bit and the lower of two phase scores (7) for the coded 0 bit. This technique of selecting the higher of the phase score measured for the coded 1 bit and the lower of the phase score measured for the coded 0 bit was repeated for the remaining 4 coded bits of 1001. The resultant phase scores for the 101001 transmitted bit sequence by the rule above now had phase scores of 20, 7, 20, 5, 9 and 19, resulting in improved discrimination at the expense of half the data rate. An alternative rule uses the sum of the redundant phase scores rather than the highest and lowest. For example, the 6 sums are 39, 20, 36, 20, 21 and 36. A new threshold of 30.5 can be used resulting in correct detection of each coded bit. Other rules are contemplated.

The data rate using the redundancy is f/20 bps instead of f/10 because twice as many cycles of the carrier signal are being used for each coded bit. However, the possibility of a decoding error is reduced as the phase scores of 20, 20 and 19 are more clearly above the 15.5 threshold for 1 bit coding and the phase scores of 7, 5 and 9 are more clearly below this 15.5 threshold for 0 bit coding as compared to the non-redundant decoding of the experiment in FIG. 4. In this redundant FIG. 4 and FIG. 4a example if the carrier was at 600 MHz, the data rate would be 600/20=30 Mbps. If the allocated channel at 600 MHz was only 30 KHz wide, then the spectral efficiency would be 1000 bps/Hz.

Figure 5:
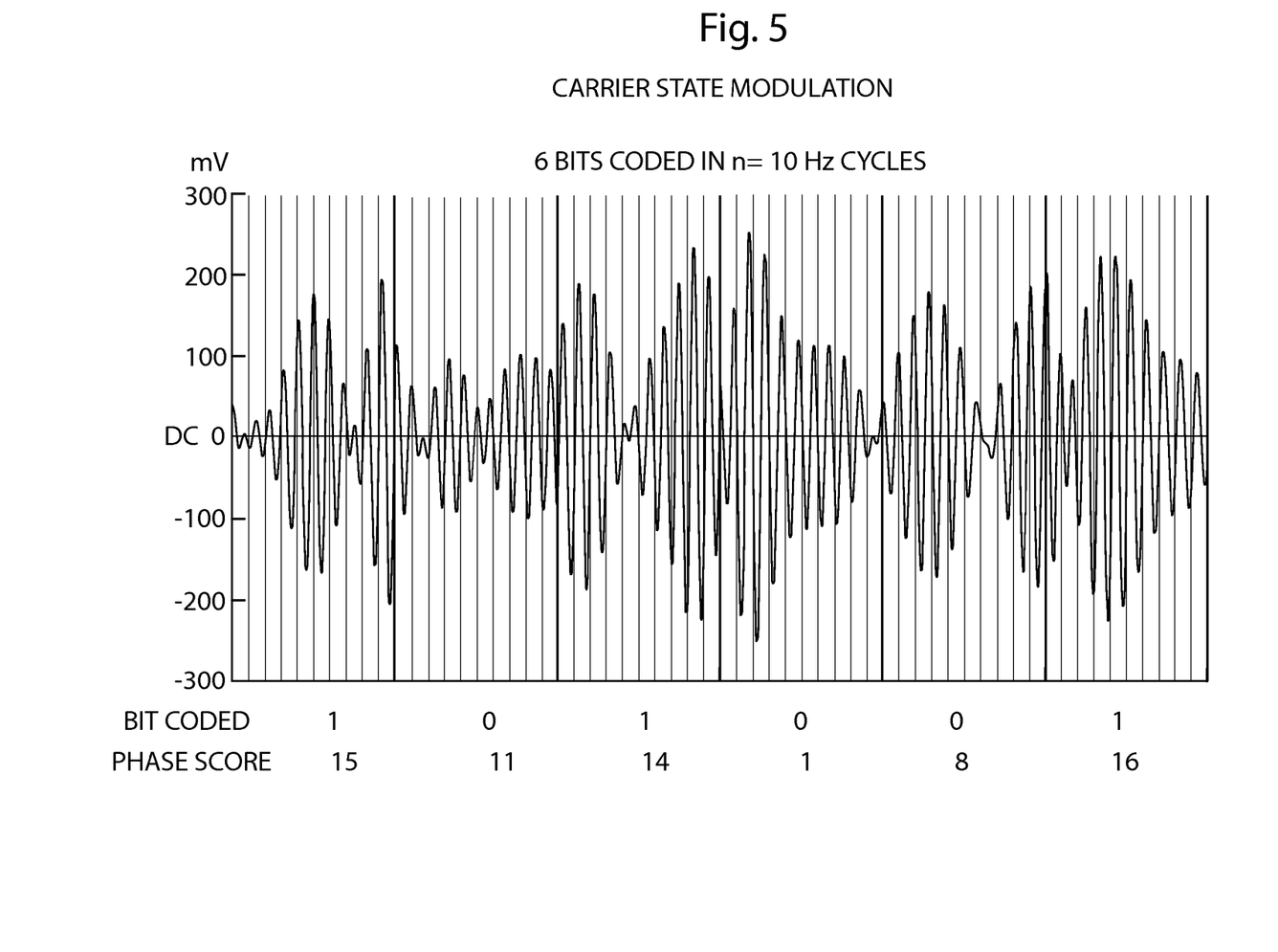
FIG. 5 illustrates a carrier state modulated signal for 6 digital bits each coded in 10 cycles of the carrier wave wherein the 0 state is coded 180 degrees-out of-phase.
Figure 5A:
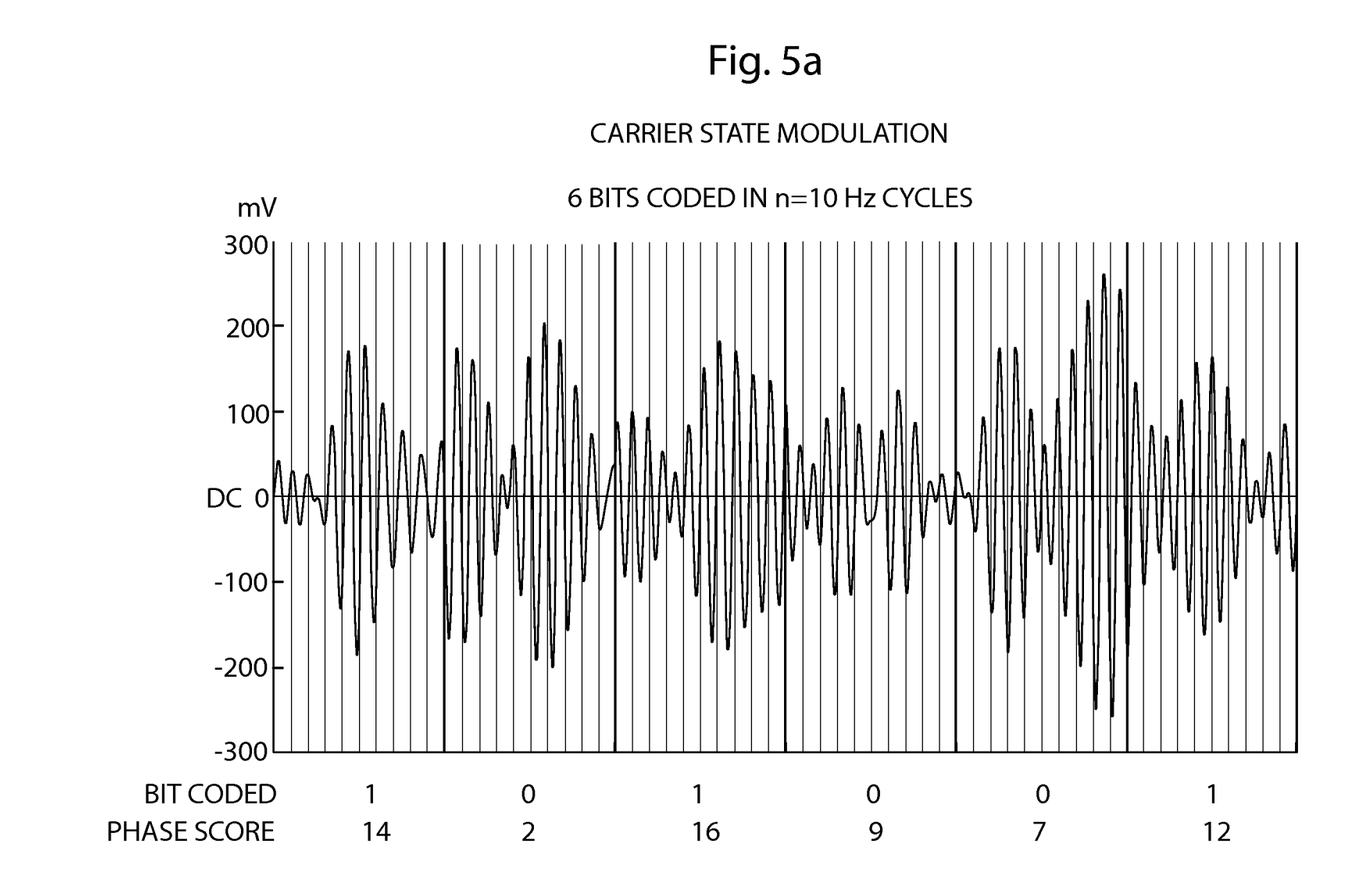
FIG. 5a illustrates a redundant carrier state modulated signal for 6 digital bits each coded in 10 cycles of the carrier wave of FIG. 5.

FIG. 5 and FIG. 5a illustrate an experiment of the method (3) of the present disclosure, the out-of-phase transmission of the 0 coded bit. Here the bit coding and the other transmitters were the same as in the experiment of FIG. 4 and FIG. 4a. However, an amplitude of 50 mV, instead of 100 mV, was received, which can make distinguishing between a coded 1 bit and coded 0 bit in the resultant CSM signal received in antenna 210 more difficult. In the FIG. 5 example, a coded 0 bit is transmitted at full amplitude 180 degrees out-of-phase with the 1 bit coding, rather than at an in-phase low amplitude as in the experiment of FIG. 4. In an implementation, there are two synchronized oscillators running at the same frequency in the transmitter: a first oscillator running 180 degrees out-of-phase with a second oscillator. In this case, a 1 coded bit is transmitted using the in phase oscillator and a 0 coded bit is transmitted using the out-of-phase oscillator. The analog transition circuit 114 in transmitter 100 can effect this phase transition smoothly, again so as to not generate interference products in many other frequencies.

The bits coded and the phase scores are displayed at the bottom of FIG. 5 and FIG. 5*a*. The A/D samples are the same as in FIG. 4 and FIG. 4*a*, except that the A/D sample are 50 mV lower in the positive direction and 50 mV greater in the negative direction for all n=10 bit states in this embodiment. Otherwise, only the coded 1 bit states would have seen the 50 mV amplitude change (from 100 mV in FIG. 4 to the 50 mV of FIG. 5). That is, the coded 1 bit was received at the reduced 50 mV, whereas the coded 0 bit was now received at −50 mV (i.e., 50 mV, 180 degrees out-of-phase).

Similar to the experiment of FIGS. 4 and 4*a*, FIG. 5*a* is a redundant transmission of the bits of FIG. 5. The selected best discrimination phase scores from FIG. 5 and redundant FIG. 5*a* transmissions using the highest/lowest rule, discussed above, was 15, 16 and 16 for the 1 coded bits, and 2, 1 and 7 for the 0 coded bits. The summation rule of adding the redundant phase scores resulted in sums of 29, 13, 30, 10, 15 and 28 for the 6 redundantly coded bits. With a threshold now set at 22.5, we again make the correct bit detections with both alternative rules.

The coded 1 bit scores are lower than the phase scores of 20, 20 and 19 of FIG. 4 due to the 50 mV lower received amplitude. However, the coded 0 bit phase scores are lower than the phase scores of 7, 5 and 9 of FIG. 4 due to the out-of-phase full power transmission of this alternative embodiment, compared to the low power transmission in FIG. 4 for coded 0 bits.

The first 20 A/D samples in the experiment of FIG. 4 coded as a 1 bit were 53, −46, 50, −63, 82, −103, 120, −130, 128, −110, 79, −43, 14, −6, 27, −76, 141, −203, 245 and −255 that resulted in a phase score of 20. That is, all of the 20 A/D measurements had the correct sign. The A/D sample values for the second coded bit (as a 0) in FIG. 4 were 136, −101, 68, −51, 57, −80, 108, −127, 126, −105, 71, −31, −4, 30, −46, 54, −53, 42, −21 and 11. This second group has a phase score of 13, where the correct signs were in samples 136, −101, 68, −51, 57, −80, 108, −127, 126, −105, 71, −31 and −11. The A/D samples for the second 0 coded bit in FIG. 5 were 86, −51, 18, −1 . . . , which is the A/D sample value adjusted for the amplitude voltage (50 mV in this experiment). These values were calculated as 86=136−50, −51=−101+50, 18=68−50 and −1=−51+50 from the FIG. 4 A/D samples.

In some implementations of the disclosed technique, the received amplitude of the Carrier State Modulation signal could be lower than the 150 mV, 100 mV and 50 mV used in the experiments of FIGS. 3-5. In such a case, it could be useful to use additional A/D converters to enhance the statistical analysis. For example, three A/D converters could be centered at 4π/10, 5π/10 and 6π/10 radians for the positive portion of the wave of the Carrier State Modulation signal, and centered at 14π/10, 15π/10 and 16π/10 radians for the negative portion of wave of the CSM signal. In this example, the perfect phase score would be 6n counts when coding a full power 1 bit, compared with the 2n counts when using 2 A/D samples per cycle as in FIG. 3, FIG. 4 and FIG. 5. In this case, the expected value of the phase score would be 3n when coding a low power 0 bit. That is, the number of A/D samples values times the number coding cycles.

It should also be appreciated that increasing n can help to recover the coded bits when the Carrier State Modulation received signal amplitude is low compared to the other transmissions in the receiving antenna.

Figure 6:
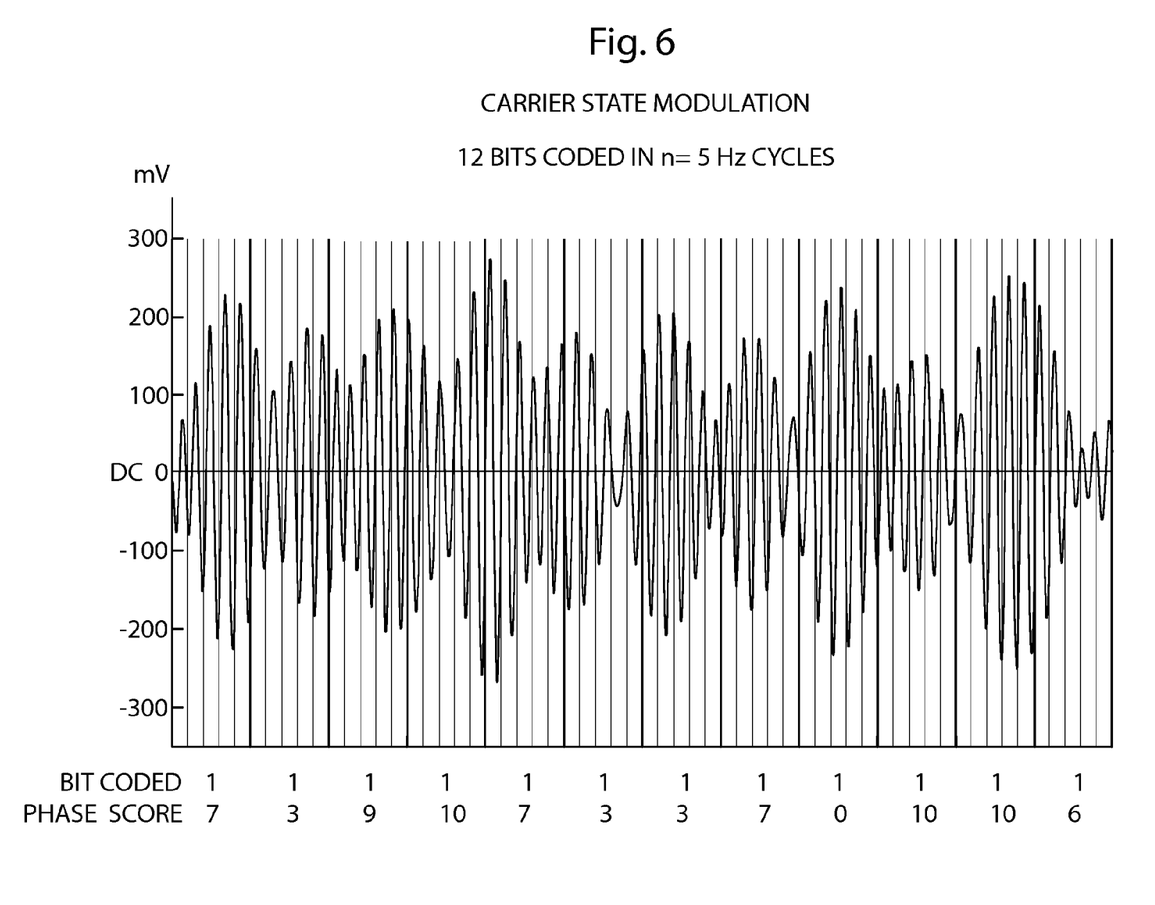
FIG. 6 is illustrates a carrier state modulated signal for 12 bits each coded in 5 cycles being received along with 3 strong other transmitters and 14 other weaker transmitters and background noise sources.
Figure 6A:
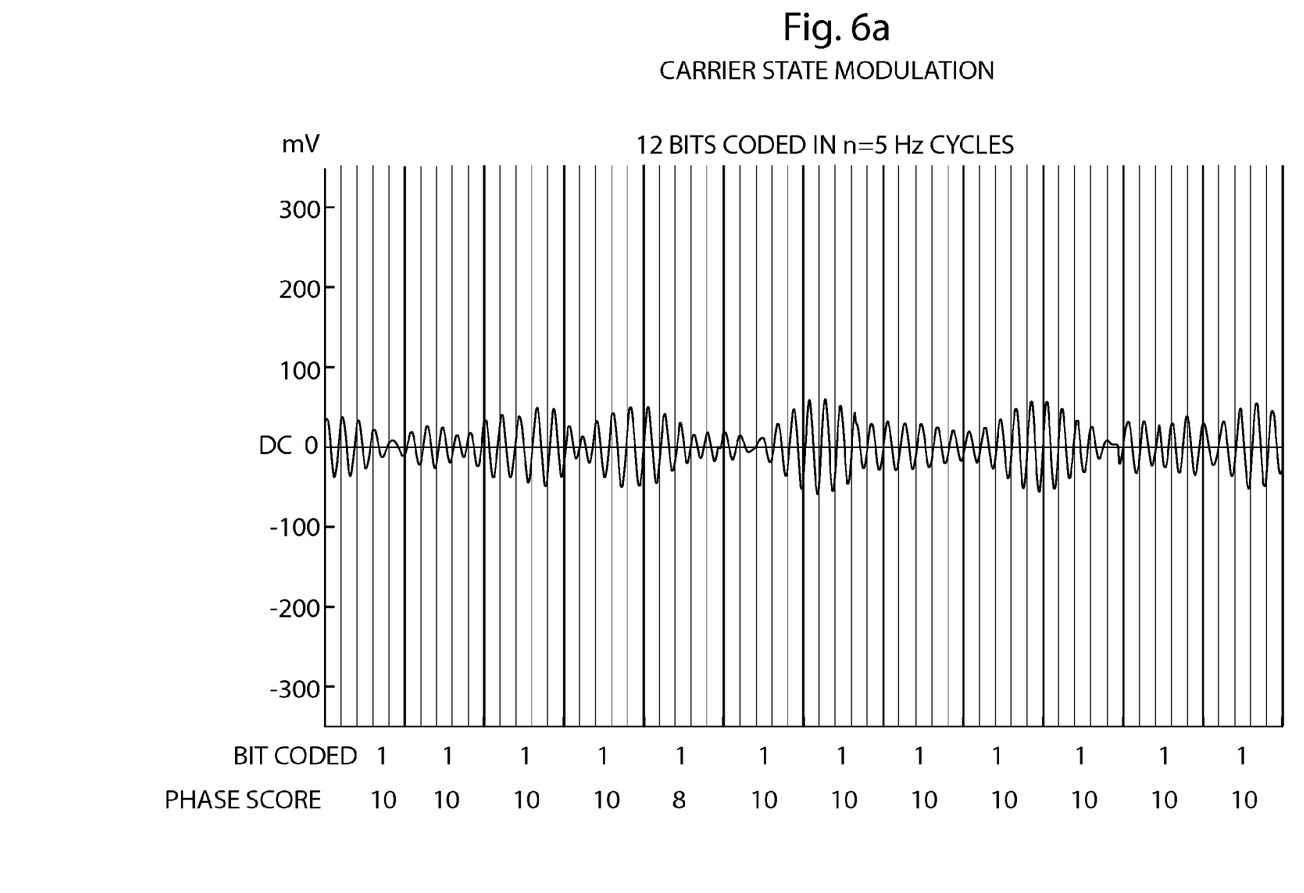
FIG. 6a illustrates the carrier state modulation signal of FIG. 6 after the 3 strong transmitters have been removed using the computational notch filter in accordance with the present disclosure.

The method (4) of the present disclosure is includes a computational notch filtering to subtract out known unwanted strong transmitters being received in the receiver antenna. This method is described and illustrated in the experiment of FIG. 6 and FIG. 6*a*. In this experiment, the receiving antenna received a superposition of 3 strong known unwanted transmitter signals, a CSM signal at only 28 mV, and 14 other noise sources and lower power transmitters (lower than 28 mV each the highest of these being at 12, 11 and 9 mV), 3 strongest unwanted transmitter frequencies can be known from their licenses (each close-by to the CSM frequency) and their average amplitudes were measured with a spectrum analyzer instrument. The unwanted strongest transmitter frequencies can also be found with a spectrum analyzer instrument whether they are licensed or unlicensed. What needs to be determined is her phase relative to the CSM synchronizer oscillator 214. The relative phases are found by iteration within an embedded processor in module 216. As will be shown below, just close estimation of these relative phases can be helpful. FIG. 6*a* shows the result of subtracting out the 3 unwanted strongest transmitters. FIG. 6 codes 12 bits in n=5 carrier cycles, all 1's for simplicity of presentation. As in the other graphical FIGS. 3-5, the bit coded and the phase score is displayed at the bottom of FIG. 6 and FIG. 6*a*.

The three unwanted strongest transmitters had the following relative frequencies, amplitudes and relative phases. The first has a relative frequency of 0.897625, received amplitude of 104 mV and relative phase of 9.2. The second has frequency 0.97625, received amplitude 96 mV and relative phase 7.5. The third strong transmitter has a relative of frequency 1.065375, received amplitude of 85 mV and relative phase of 3.

The phase scores in FIG. 6 are 7, 3, 9, 10, 7, 3, 3, 7, 0, 10, 10, 6, The expected value for a 0 coded bit is 5 (because n=5), and the maximum value for a 1 coded bit is 10 (because there are two A/D samples for each of 5 cycles of the CSM signal), if the threshold were set at 7.5 (only phase scores of 8, 9 or 10 would identify a 1 coded bit), then we would have made 8 bit decoding errors out of the 12 coded bits in the FIG. 6 example. However, in FIG. 6*a* after estimating the relative phases of the 3 strongest unwanted transmissions and subtracting their individual contributions out of each A/D using formula 1, the phase scores resulted in 11 of the 12 bits coded in the 1 state now being at the maximum phase score of 10 and one at a phase score of 8, thus detecting all twelve 1 coded bits correctly.

Because the 14 weaker sources at random should average towards 0 mV in superposition, while the CSM signal always contributed 28 mV in absolute value. The phase converging process found average absolute residual values (the A/D minus the 3 strongest contributions) to be about 25 mV when the phase estimates got close to their actual relative phase values, and diverged to over 100 mV (near the average of the 3 strongest amplitudes when the phase estimates were not close to their actual values). For example, with the relative phases at 11, −5 and 5 the absolute residual value was about 70 mV. Then with the relative phases at 10, −6 and 4 the absolute residual value had decreased to about 41 mV. But at relative phases 9.6, −7.1 and 3.4 (getting close to their actual relative phase values) the residual was near its approximate minimum of 25 mV, and the phase scores were the same as shown in FIG. 6a. In actual implementation, the memory in receiver module 216 can buffer A/D samples to match the delay tune of the phase iteration calculation, and then proceed in real time computing and subtracting each unwanted contribution per equation 3 incremented by 1π.

$$contribution = amplitude * \sin[(phase+i-0.5)*\pi/frequency] \quad (3)$$

wherein amplitude is a level of the unwanted frequency, phase is the phase of the unwanted frequency relative to the A/D samples, i=1 for the first A/D sample and i is incremented by 1 for each additional A/D sample, and frequency is the unwanted frequency relative to the carrier state modulation signal.

A Carrier State Modulation signal transmission has an initialization process. This process starts by A/D sampling the antenna signal for a period of time, with that sampled signal being made up of whatever was being received. Then a test sequence of different a Hz full power Carrier State Modulation transmissions (coding a 1 bit) interspersed with a cycles coding a 0 bit or other selected test sequence is coded and transmitted. The variation in decoding by the receiver is assessed in order to select a suitable n and a threshold for the detector rule. The receiver apparatus contains logic to closely center the A/D samples to the full power 1 bit coding on the carrier. One method in logic for this centering process is to select a preset time offset increment from the many included. Other alternative or equivalent means might be utilized to synchronize the A/D sampling, Centering could be judged to be achieved when the phase scores cluster near their kn maximum for k samples in n cycles.

Carrier State Modulation transmissions are rate adaptive, and can be changed when more random variation appears or lessens, such as at night and daytime RF traffic differences. That is, n and/or the transmission modulation amplitude value can be varied based on the number of unwanted signals and levels received at the receiver antenna. Techniques have been described above to account for variations in the number and level of unwanted signals: changing n, using redundancy, coding 0 bits with out-of-phase transmission, and subtracting values of known received unwanted signals. It should be appreciated that small redundant blocks of bits could be transmitted more than 2 times when this is useful for improved error performance, or simply when customer data is slack compared to link capacity. It should further be appreciated that the hardware apparatus could be designed in a variety of logics, embedded or external processors and accompanying software that meet the requirements of a Carrier State Modulation link.

Other embodiments of the invention are within the scope of the following claims.

What is claimed is:

1. A receiver for detecting digital data bits from a carrier state modulated signal received from a transmitter, comprising:
    an antenna to receive the carrier state modulated signal;
    a statistical detector to determine a phase score for a specified number of cycles of the carrier state modulated signal based on a first number of samples of an amplitude on a positive side of each cycle of the carrier state modulated signal that is above a selected amplitude and a second number of samples of an amplitude on a negative side of each cycle of the carrier state modulated signal that is below the selected amplitude;
    a controller to detect a value of a digital data bit of the carrier state modulated signal based on the phase score; and
    an interface unit to output the value of the digital data bit of the carrier state modulated signal.

2. The receiver of claim 1, comprising
    at least one first A/D converter to determine the first number of samples; and
    at least one second A/D converter to determine the second number of samples.

3. The receiver of claim 2, wherein a first A/D converter samples each cycle of the carrier state modulated signal at π/2 radians and a second A/D converter samples each cycle of the carrier state modulated signal at 3π/2 radians.

4. The receiver of claim 2, comprising:
    a processor to identify one or more frequencies received other than the frequency of the carrier state modulated signal that contribute to the first and second A/D samples,
    wherein the statistical detector subtracts the one or more identified frequencies that contribute to the first and second A/D samples.

5. The receiver of claim 4, wherein each of the one or more frequencies that contribute to the $i^{th}$ A/D sample is subtracted according to the formula:

$$contribution = amplitude * \sin\lfloor(phase+i-0.5)*\pi/frequency\rfloor$$

wherein amplitude is a level of an identified frequency, phase is the phase of the identified frequency relative to the A/D samples, i=1 for the first A/D sample and i is incremented by 1 for each additional A/D sample, and frequency is the identified frequency relative to the carrier state modulation signal.

6. The receiver of claim 1, wherein the controller detects a first value of the digital data bit when the phase score is above a threshold value and a second value of the digital data bit when the phase score is below the threshold value.

7. The receiver of claim 1,
    wherein the statistical detector determines a redundant phase score for the specified number of cycles of the carrier state modulated signal based on a third number of samples of the amplitude on the positive side of each cycle of the carrier state modulated signal that is above the selected amplitude and a fourth number of samples of the amplitude on the negative side of each cycle of the carrier state modulated signal that is below the selected amplitude; and
    wherein the controller detects the value of the digital data bit of the carrier state modulated signal based on the phase score and the redundant phase score using a rule.

8. The receiver of claim 7, wherein the rule is to select the highest of either the phase score or the redundant phase score for comparison to a threshold value when the value of the digital bit is a first digital value and to select the lowest of either the phase score or the redundant phase score for comparison to the threshold value when the value of the digital bit is a second digital value.

9. A method of detecting digital data bits from a carrier state modulated signal received from a transmitter, comprising:
    receiving the carrier state modulated signal on an antenna;
    determining a phase score for a specified number of cycles of the carrier state modulated signal based on a first number of samples of an amplitude on a positive side of each cycle of the carrier state modulated signal that is above a selected amplitude and a second number of samples of an amplitude on a negative side of each cycle of the carrier state modulated signal that is below the selected amplitude;

detecting a value of a digital data bit of the carrier state modulated signal based on the phase score; and outputting the value of the digital data bit of the carrier state modulated signal.

10. The method of claim 9, comprising determining the first number of samples with at least one first A/D converter; and determining the second number of samples with at least one second A/D converter.

11. The method of claim 10, wherein a first A/D converter samples each cycle of the carrier state modulated signal at $\pi/2$ radians and a second A/D converter samples each cycle of the carrier state modulated signal at $3\pi/2$ radians.

12. The method of claim 10, comprising:

subtracting one or more frequencies other than the carrier state modulated signal that contribute to the first and second A/D samples.

13. The method of claim 12, wherein each of the one or more frequencies that contribute to an $i^{th}$ A/D sample is subtracted according to the formula:

contribution=amplitude*sin [(phase+i−0.5)*π/frequency]

wherein amplitude is a level of an identified frequency, phase is the phase of the identified frequency relative to the A/D samples, i=1 for the first A/D sample and i is incremented by 1 for each additional A/D sample, and frequency is the identified frequency relative to the carrier state modulation signal.

14. The method of claim 9, wherein the detecting includes detecting a first value of the digital data bit when the phase score is above a threshold value and a second value of the digital data bit when the phase score is below the threshold value.

15. The method of claim 9, comprising:

determining a redundant phase score for the specified number of cycles of the carrier state modulated signal based on a third number of samples of the amplitude on the positive side of each cycle of the carrier state modulated signal that is above the selected amplitude and a fourth number of samples of the amplitude on the negative side of each cycle of the carrier state modulated signal that is below the selected amplitude; and wherein the detecting includes detecting the value of the digital data bit of the carrier state modulated signal based on the phase score and the redundant phase score using a rule.

16. The method of claim 15, wherein the rule is to sum the phase score with the redundant phase score for comparison to a threshold value and detecting a first digital bit value when the sum is higher than the threshold and detecting a second digital bit value when the sum is lower than the threshold value.

* * * * *